(12) United States Patent
Shimomura et al.

(10) Patent No.: US 9,230,628 B2
(45) Date of Patent: Jan. 5, 2016

(54) MAGNETIC MEMORY

(71) Applicant: KABUSHIKI KAISHA TOSHIBA, Minato-ku (JP)

(72) Inventors: Naoharu Shimomura, Tokyo (JP); Eiji Kitagawa, Yokohama (JP); Minoru Amano, Sagamihara (JP); Daisuke Saida, Tokyo (JP); Kay Yakushiji, Tsukuba (JP); Takayuki Nozaki, Tsukuba (JP); Shinji Yuasa, Tsukuba (JP); Akio Fukushima, Tsukuba (JP); Hiroshi Imamura, Tsukuba (JP); Hitoshi Kubota, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/198,982

(22) Filed: Mar. 6, 2014

(65) Prior Publication Data

US 2014/0269038 A1    Sep. 18, 2014

(30) Foreign Application Priority Data

Mar. 14, 2013  (JP) ................................. 2013-051806

(51) Int. Cl.
*G11C 11/00* (2006.01)
*G11C 11/16* (2006.01)
(Continued)

(52) U.S. Cl.
CPC ............ *G11C 11/165* (2013.01); *G11C 11/155* (2013.01); *H01F 10/3254* (2013.01);
(Continued)

(58) Field of Classification Search
CPC .................................................. G11C 11/155

USPC .......................................................... 365/158
See application file for complete search history.

(56) References Cited

U.S. PATENT DOCUMENTS 7,611,912 B2 * 11/2009 Hong et al. ........................ 438/3
8,908,428 B2 * 12/2014 Ong et al. ...................... 365/171
(Continued)

FOREIGN PATENT DOCUMENTS

JP         2005-183579         7/2005

OTHER PUBLICATIONS

T. Maruyama, et al., "Large voltage-induced magnetic anisotropy change in a few atomic layers of iron", Nature Nanotechnology, vol. 4, Mar. 2009, pp. 158-161.
(Continued)

*Primary Examiner* — Son Mai
(74) *Attorney, Agent, or Firm* — Oblon, McClelland, Maier & Neustadt, L.L.P.

(57) ABSTRACT

A magnetic memory according to an embodiment includes at least one MTJ element, the MTJ element including: a magnetic multilayer structure including a first magnetic layer in which a direction of magnetization is fixed, a second magnetic layer in which a direction of magnetization is changeable, and a tunnel barrier layer located between the first and second magnetic layers; a first electrode provided on a first surface of the magnetic multilayer structure; a second electrode provided on a second surface of the magnetic multilayer structure; an insulating film provided on a side surface of the magnetic multilayer structure; and a control electrode provided on the side surface of the magnetic multilayer structure with the insulating film located therebetween, a voltage being applied to the control electrode in a read operation, which increases an energy barrier for changing the magnetization of the second magnetic layer.

22 Claims, 8 Drawing Sheets

(51) Int. Cl.
*H01L 43/02* (2006.01)
*H01L 43/08* (2006.01)
*H01L 27/22* (2006.01)
*G11C 11/155* (2006.01)
*H01F 10/32* (2006.01)
*H01F 10/12* (2006.01)

(52) U.S. Cl.
CPC .......... *H01F10/3286* (2013.01); *H01L 27/228* (2013.01); *H01L 43/02* (2013.01); *H01L 43/08* (2013.01); *H01F 10/123* (2013.01)

(56) References Cited

U.S. PATENT DOCUMENTS

2010/0003767 A1* 1/2010 Cho .................................. 438/3
2012/0069647 A1 3/2012 Kramer et al.
2013/0075843 A1 3/2013 Inokuchi et al.

OTHER PUBLICATIONS

S. Kanai, et al., "Electric field-induced magnetization reversal in a perpendicular-anisotropy CoFeB—MgO magnetic tunnel junction", Applied Physics Letters, vol. 101, 2012, pp. 122403-1-122403-3.

F. Bonell, et al., "Large change in perpendicular magnetic anisotropy induced by an electric field in FePd ultrathin films", Applied Physics Letters, vol. 98, 2011, pp. 232510-1-232510-3.

* cited by examiner

| | | BL<t> | BL<t+1> | EL<s> | EL<s+1> |
|---|---|---|---|---|---|
| THE POTENTIAL OF THE STORAGE LAYER BECOMES STABLE WITH THE CONDITION (POTENTIAL OF CONTROL ELECTRODE>POTENTIAL OF STORAGE LAYER) | WRITE | 0.5V | 0V | ≦0.5V | 1.5V |
| | READ | 0.3V | 0V | 1.5V | 1.5V |
| THE POTENTIAL OF THE STORAGE LAYER BECOMES STABLE WITH THE CONDITION (POTENTIAL OF CONTROL ELECTRODE<POTENTIAL OF STORAGE LAYER) | WRITE | 0.5V | 1.5V | ≧0.5V | 0V |
| | READ | 0.3V | 1.5V | 0V | 0V |

MAGNETIC MEMORY

CROSS REFERENCE TO RELATED APPLICATIONS

This application is based upon and claims the benefit of priority from the prior Japanese Patent Application No. 2013-51806, filed on Mar. 14, 2013, the entire contents of which are incorporated herein by reference.

FIELD

Embodiments described herein relate generally to magnetic memories.

BACKGROUND

Magnetoresistive random access memories (MRAMs) use magnetization switching. Spin transfer torque MRAMs employing a spin transfer torque writing method operate at a high speed, can be highly integrated, and have high durability. Thus, such MRAMs are expected to be general-purpose nonvolatile random access memories.

Magnetic tunnel junction (MTJ) elements are used as storage elements of the spin transfer torque MRAMs. An MTJ element includes a storage layer having a magnetic layer in which the direction of magnetization can be switched by a write operation of the memory, a reference layer having a magnetic layer in which the direction of magnetization is fixed to one direction, and a tunnel barrier layer located between the storage layer and the reference layer to form a tunnel barrier. The electric resistance of the MTJ element switches between a low-resistance state and a high-resistance state when a current flows in a direction perpendicular to the film plane of the MTJ element depending on whether the magnetizations of the storage layer and of the reference layer are parallel or antiparallel to each other. Data (information) can be read from the MTJ element using the difference in resistance between the parallel state and the antiparallel state.

The spin transfer torque writing is performed by causing a current to flow in a direction perpendicular to the film plane of the MTJ element to switch the direction of magnetization of the storage layer. For example, in order to switch the direction of magnetization from the antiparallel state to the parallel state, a current is caused to flow so that electrons flow from the reference layer to the storage layer. The direction of the current is opposite to the direction of the electrons, from the storage layer to the reference layer. As a result, the spin transfer torque acts on the magnetization of the storage layer to turn to the direction parallel to the direction of magnetization of the reference layer. If the current has an intensity of a predetermined threshold value, the direction of magnetization of the storage layer can be switched. On the contrary, in order to switch the direction of magnetization from the parallel state to the antiparallel state, a current is caused to flow so that electrons flow from the storage layer to the reference layer. In this case, the spin transfer torque acts on the magnetization of the storage layer to turn to the direction antiparallel to the direction of magnetization of the reference layer. By changing the direction of electrons in such a manner, data can be rewritten.

A resistive random access memory employing spin transfer torque writing applies an electric current to the MTJ element through a common path in a read operation and a write operation. This leads to potential data-rewriting in read operations, read disturb. In order to avoid the risk of read disturb, a method is used in which a read current flowing through the MTJ element in a read operation is set to be lower than a write current flowing in a write operation. The probability of occurrence of read disturb can be reduced by this technique. However, decreasing the read current would lead to decreasing the read sensitivity. For this reason, the value of the read current that can be practically used has a lower limit.

In order to avoid read disturb, a method is proposed in which the probability of occurrence of read disturb is reduced by setting the pulse width of read current to be narrower than that of write current. The pulse width of write current in a memory required to operate at a high rate, however, should be reduced, and therefore the pulse width of read current should be reduced further. Since the pulse width of read current has a lower limit due to the read sensitivity and a problem of delay in current pulse caused by wiring, it is rather difficult to set the pulse width of the read pulse narrower than that of the write pulse.

DETAILED DESCRIPTION

A magnetic memory according to an embodiment includes at least one MTJ element, the MTJ element including: a magnetic multilayer structure including a first magnetic layer in which a direction of magnetization is fixed, a second magnetic layer in which a direction of magnetization is changeable, and a tunnel barrier layer located between the first magnetic layer and the second magnetic layer; a first electrode provided on a first surface of the magnetic multilayer structure on a side opposite to a side of the tunnel barrier layer relative to the first magnetic layer; a second electrode provided on a second surface of the magnetic multilayer structure on a side opposite to a side of the tunnel barrier layer relative to the second magnetic layer; an insulating film provided on a side surface of the magnetic multilayer structure, which side surface is different from the first surface and the second surface of the magnetic multilayer structure; and a control electrode provided on the side surface of the magnetic multilayer structure with the insulating film located therebetween, a voltage being applied to the control electrode in a read operation, which increases an energy barrier for changing the magnetization of the second magnetic layer.

Before embodiments are described, how the embodiments have been reached will be described below.

(Principle)

A phenomenon is known in which a voltage applied to electrodes located above and below a multilayer structure including a magnetic layer and an insulating film would change the magnetic anisotropy energy in the direction of the voltage application. This phenomenon is caused by an interaction between an electric charge induced in the vicinity of an interface between the magnetic layer and the insulating film, and spin-polarized electrons of the magnetic layer.

Figure 1:
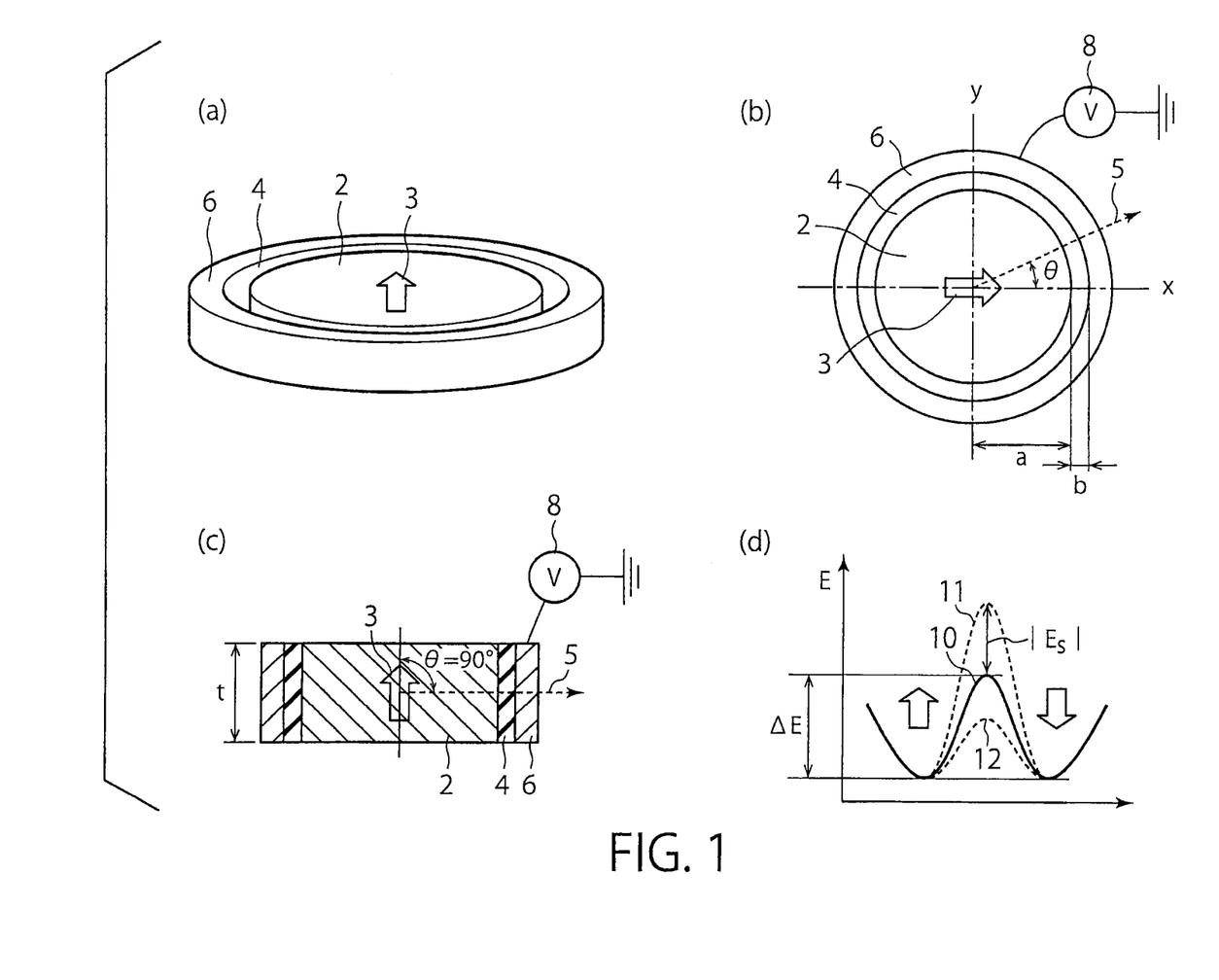
FIGS. 1(a) to 1(d) are diagrams explaining the principle of energy barrier control required for magnetization switching, performed by applying a voltage to a side surface of a magnetic layer, in which the magnetization is perpendicular to the film plane.

The present inventors found, for the first time ever, that a voltage applied between a magnetic layer, in which the direction of magnetization is perpendicular to the film plane, and an electrode located on the side of the magnetic layer with an insulating film located therebetween can control the energy barrier for magnetization-switching with a high efficiency. The film plane means the top surface of the magnetic layer. The principle of this phenomenon will be described with reference to FIGS. 1(a) to 1(d). FIG. 1(a) shows a simplified model of the principle. This model includes a magnetic layer 2 having a disk shape, an insulating film 4 surrounding the side surface of the magnetic layer 2, and a control electrode 6 located on the side of the insulating film 4 opposite to the side of the magnetic layer 2.

The magnetic layer 2 simulates the storage layer of the MTJ element. A voltage can be applied between the control electrode 6 and the magnetic layer 2. A power supply 8, for example, is connected to the control electrode 6 as shown in FIGS. 1(b) and 1(c), and the potential of the magnetic layer 2 is fixed to be zero. The thick arrow represents magnetization 3. A macrospin model, in which the direction of the magnetization 3 is fixed, is considered. FIG. 1(b) shows a horizontal section of the model shown in FIG. 1(a), in which the magnetization is oriented within the film plane (hereinafter also referred to as the "in-plane" direction). Since the easy magnetization axis of the magnetic layer 2 is perpendicular to the plane surface, FIG. 1(b) shows the state where the magnetization 3 is directed to the hard magnetization axis. Since the magnetic layer 2 is in a disk shape, if the magnetization is in the in-plane direction, energy is equivalent in any direction.

Let the center of the disk be the point of origin as shown in FIG. 1(b). The x-axis and the y-axis extend in in-plane directions, of which the x-axis is the direction of magnetization 3. If a voltage is applied between the control electrode 6 and the magnetic layer 2, an electric charge is induced at the interface between the insulating film 4 and the magnetic layer 2 to change the magnetic anisotropy energy perpendicular to the interface.

If the insulating film is formed of MgO, and the magnetic layer contains Fe and has magnetization in an in-plane direction, for example, a negative voltage applied to an electrode located on the side opposite to the side of the magnetic layer relative to the insulating film increases the magnetic anisotropy energy in the direction perpendicular to the interface between the insulating film and the magnetic layer. This makes the direction perpendicular to the interface stabler. On the contrary, a positive voltage applied to the above electrode decreases the magnetic anisotropy energy in the direction perpendicular to the interface. This makes the direction parallel to the interface, i.e., a direction perpendicular to the normal line of the interface, stabler.

It is also known that a change in magnetic anisotropy energy due to voltage application occurs in an MTJ element having a multilayer structure including a CoFeB layer, which has perpendicular magnetic anisotropy, an MgO layer, and a CoFeB layer. Specifically, if a negative voltage is applied to an electrode located on the side of the storage layer relative to the layer of MgO serving as a tunnel barrier, and a positive voltage is applied to an electrode located on the side of the reference layer, perpendicular magnetic anisotropy energy in the storage layer decreases. If a positive voltage is applied to the electrode located on the side of the storage layer and a negative voltage to the electrode located on the side of the reference layer, the perpendicular magnetic anisotropy energy in the storage layer increases.

Furthermore, it is also known that if a positive voltage is applied to the electrode located on the side opposite to the side of the magnetic layer, magnetic anisotropy energy in the direction perpendicular to the interface increases. For example, a case is considered where a voltage is applied to a multilayer film (MgO/FePd) including a magnetic layer of FePd having the $L1_0$ structure, in which the magnetization is perpendicular to the film plane, and an insulating layer of MgO. It is known that a positive voltage applied to an electrode located on the side of an insulating layer of MgO relative to an electrode located on the side of a magnetic layer of FePd increases, and a negative voltage decreases, the perpendicular magnetic anisotropy energy.

In the model shown in FIG. 1(a), the interface between the insulating film 4 and the magnetic layer 2 covers the entire side surface of the magnetic layer 2. Accordingly, the amount of change in magnetic anisotropy energy of the entire magnetic layer 2 can be obtained by integrating the amount of change in magnetic anisotropy energy in fine regions at respective points of the interface with respect to the entire side surface. Let Ks represent the amount of change in magnetic anisotropy energy per unit area of the interface in a case where the direction of the magnetization is perpendicular to the interface. Also let θ shown in FIG. 1(b) represent an angle between a normal vector 5 of the interface and the direction of magnetization in the x-y plane. In this case, at a point on the direction of the normal vector 5, the amount of change in magnetic anisotropy energy, $\delta E_s$, derived from the electric field applied to a fine region in the interface at this point, can be expressed by the following expression:

$$\delta E_s = K_s \cos^2 \theta \delta S \qquad (1)$$

where $\delta S$ represents the area of the fine region in the interface. The amount of change $E_s$ in magnetic anisotropy energy with respect to the entire interface caused by the applied voltage can be obtained by integrating the amount of change in energy $\delta E_s$ by the following expression:

$$E_s = \tfrac{1}{2} K_s S \qquad (2)$$

where S represents the area of the entire interface.

FIG. 1(c) shows the state where the magnetization of the magnetic layer 2 of the model is oriented to the perpendicular direction, the easy magnetization axis. In this case, the angle θ between the normal vector 5 and the magnetization 3 is the right angle. Accordingly, the value of the expression (1) is zero at all the points on the interface. As a result, the amount of change in magnetic anisotropy energy $E_s$ obtained by the integration with respect to the entire interface also becomes zero.

FIG. 1(d) is a diagram schematically plotting the potential energy of the magnetic layer 2 with respect to the direction of magnetization. The two points where the potential energy is the lowest represent the states where the magnetization 3 is perpendicular to the film plane, and oriented upward and downward. The point where the potential energy is the highest represents the state where the magnetization 3 is in the in-plane direction. The energy barrier for changing (switching) the magnetization is the difference between the amounts of the potential energy in these states. The solid line 10 represents the potential energy in a case where the potential of the control electrode 6 is equal to that of the magnetic layer 2, and ΔE represents the energy barrier required for the switching in this case. Chain lines 11 and 12 show the states of potential energy in a case where a voltage is applied between the magnetic layer 2 and the control electrode 6.

If the amount of change $E_s$ in magnetic anisotropy energy caused by the applied voltage is positive, the highest value of the potential energy, which means that the magnetization is oriented in the in-plane direction, is stabler than that in the case where no voltage is applied. As a result, the highest value decreases by $|E_s|$. An example of this state is indicated by the chain line 12. On the contrary, if the amount of change Es is negative, the highest value of the potential energy becomes unstable, and increases by $|E_s|$ as indicated by the chain line 11. Thus, the application of voltage changes the highest value of the potential energy by $|E_s|$.

As described above with reference to FIG. 1(c), the lowest value of the potential energy is not changed by the voltage application. As a result, a voltage applied to the interface changes the energy barrier ΔE for switching the magnetization. If a voltage having a polarity for increasing the perpendicular magnetic anisotropy energy at the interface between the magnetic layer 2 and the insulating film 4 is applied, ΔE decreases, and if a voltage having a polarity for decreasing the perpendicular magnetic anisotropy energy at the interface is applied, ΔE increases. The absolute value of the amount of change is equal to the value obtained by the expression (2).

As can be understood from FIG. 1(d), an increase in energy barrier ΔE for switching the magnetization of the storage layer means that the magnetization of the storage layer becomes more difficult to be switched. Accordingly, this energy barrier ΔE may also be called "memory retention energy."

When relocation of occupying state in electron orbitals that contribute to spin polarization is induced by applying a voltage, the magnetic anisotropy perpendicular to the film plane may also be directly controlled by applying the voltage to the sidewall because of the dependence of electron occupancy in each electron orbital. In this case, not only the interface magnetic anisotropy but also the perpendicular magnetic anisotropy of a material having a high crystal magnetic anisotropy can be directly controlled.

Next, a result of estimation of the change rate of perpendicular magnetic anisotropy energy changed by applying a voltage to the side surface of the storage layer of the MTJ element of the simplified model will be described below. Let a represent the radius of the magnetic layer 2, and b represent the thickness of the insulating film 4 between the magnetic layer 2 and the control electrode 6, shown in FIG. 1(b), and let t represent the thickness of the magnetic layer 2 shown in FIG. 1(c). In this case, the capacitance C of a cylindrical capacitor formed of the magnetic layer 2, the insulating film 4, and the control electrode 6 can be expressed by the following expression (3):

$$C = \frac{2\pi\varepsilon_r\varepsilon_0 t}{\ln\left(\frac{a+b}{a}\right)} \tag{3}$$

where $\varepsilon_0 = 8.85 \times 10^{-12}$ (F/m) represents the dielectric constant of vacuum, and $\varepsilon_r$ represents the relative dielectric constant of the insulating film 4. The amount of surface-accumulated charge caused by applying a voltage V (V) between the magnetic layer 2 and the electrode 6 can be obtained from the expression (3) as follows:

$$Q = CV = \frac{2\pi\varepsilon_r\varepsilon_0 t}{\ln\left(\frac{a+b}{a}\right)} \tag{4}$$

The surface area in which the charge is accumulated is S=2πat.

The amount of change $K_s$ in magnetic anisotropy energy per unit area of the interface is proportional to the amount of electric charge per unit area of the interface, and can be expressed as follows:

$$K_s = c_s \frac{Q}{S} \tag{5}$$

where $c_s$ represents the constant of proportionality, which is determined by the material and the state of the interface of the magnetic layer 2. A higher $c_s$ means that the magnetic anisotropy energy changes with higher efficiency due to the applied voltage.

The amount of change in energy barrier for switching the magnetization by applying a voltage to the interface can be expressed by the following expression using the expressions (2), (4), and (5):

$$E_s = c_s \frac{\pi\varepsilon_r\varepsilon_0 tV}{\ln\left(\frac{a+b}{a}\right)} \tag{6}$$

Thus, the efficiency in changing the magnetic anisotropy energy can be improved by increasing $\varepsilon_r$ by employing, to form the interface, a magnetic layer 2 formed of a material having a high constant of proportionality $c_s$ and an insulating film 4 having a high dielectric constant.

First Embodiment

A magnetic memory according to the first embodiment will be described with reference to FIGS. 2 to 3(c). The magnetic memory according to the first embodiment includes at least one memory cell, which has, as a storage element, an MTJ element 20 shown in FIG. 2. The MTJ element 20 includes a lower electrode 21, a magnetic layer 22 on the lower electrode 21, a tunnel barrier layer 23 on the magnetic layer 22, a magnetic layer 24 on the tunnel barrier layer 23, and an upper electrode 26 on the magnetic layer 24, the magnetic layer 22, the tunnel barrier layer 23, and the magnetic layer 24 forming a multilayer structure 25. The MTJ element 20 further includes an insulating film 27 on a side surface of the multilayer structure 25, and a control electrode 28 on a side surface of the insulating film 27 opposite to the side of the multilayer structure 25. The insulating film 27 shown in FIG. 2 extends over the top surface of the lower electrode 21, and on part of the side surface of the upper electrode 26, besides the side surface of the multilayer structure 25. The magnetic layer 22 and the magnetic layer 24 can be in a disk shape as shown in FIG. 1(a), or in an arbitrary shape enclosed by a closed curve.

One of the magnetic layer 22 and the magnetic layer 24 serves as a reference layer, in which the direction of magnetization is perpendicular to the film plane and fixed, and the other serves as a storage layer, in which the direction of magnetization is perpendicular to the film plane and changeable. The fixing of the direction of magnetization means that when a write current flows between the lower electrode 21 and the upper electrode 26, the direction of magnetization is unchanged before and after the flowing of the write current. The direction of magnetization that is changeable means that when a write current flows between the lower electrode 21 and the upper electrode 26, the direction of magnetization may be changed after the write current flows. In FIG. 2, the magnetic layer 22 serves as the reference layer, and the magnetic layer 24 serves as the storage layer. However, contrary to the state shown in FIG. 2, the magnetic layer 22 can be the storage layer, and the magnetic layer 24 can be the reference layer.

Figure 2:
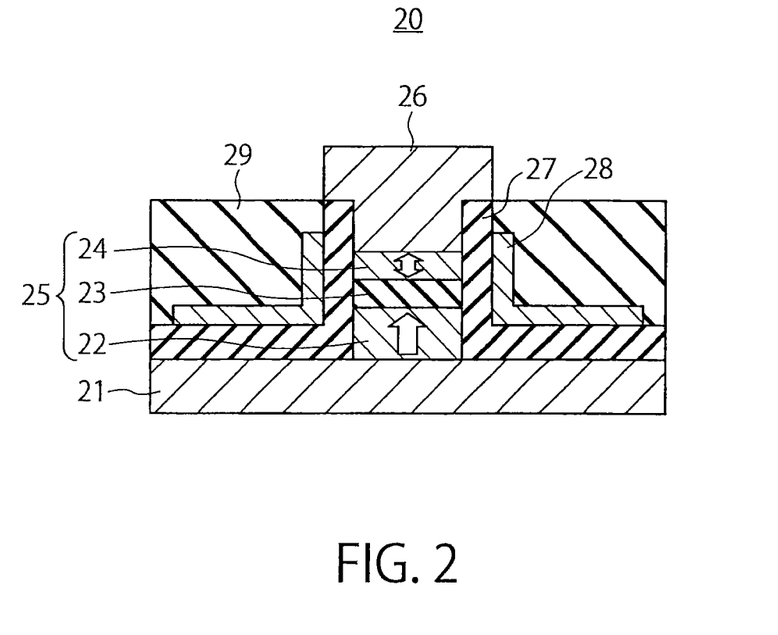
FIG. 2 is a cross-sectional view showing an MTJ element of a magnetic memory according to the first embodiment.
Figure 3:
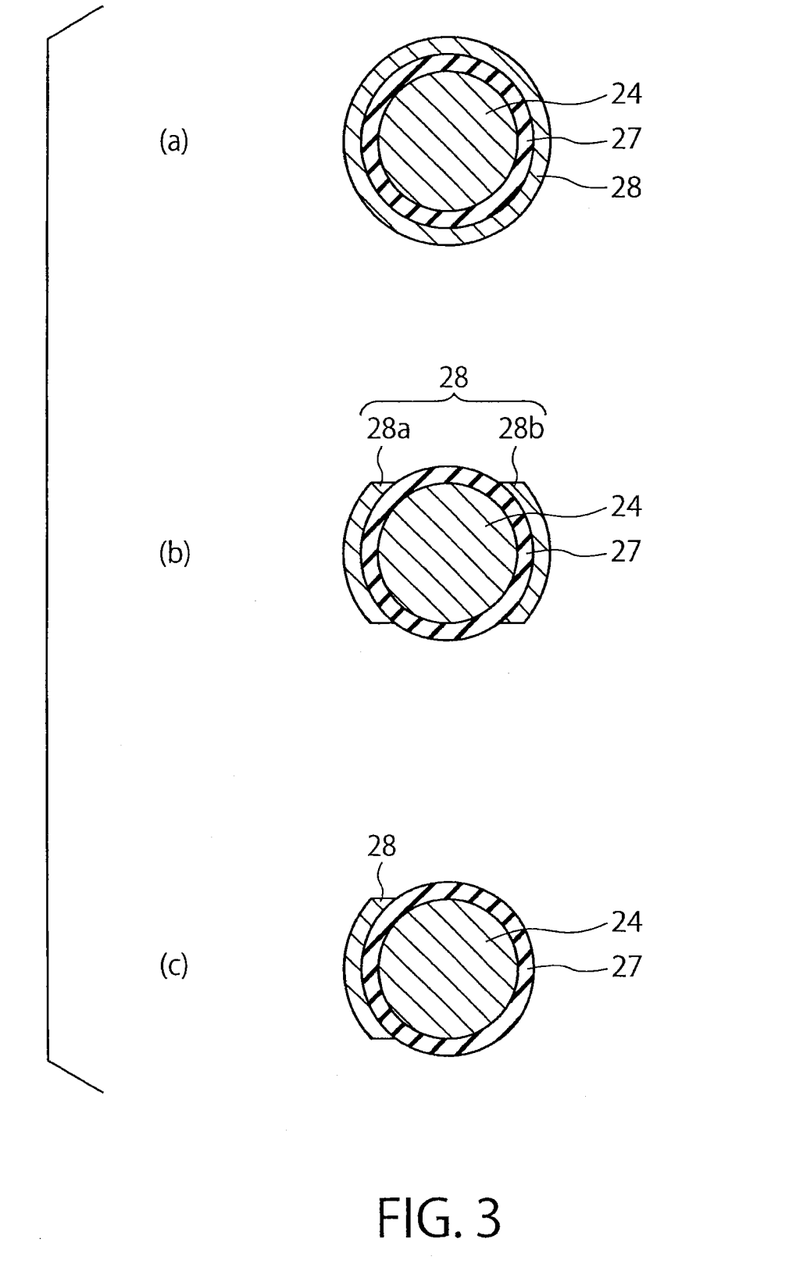
FIGS. 3(a) to 3(c) are diagrams explaining locations of a storage layer and a control electrode of the magnetic memory according to the first embodiment.

The control electrode 28 is located at least on the side surface of the magnetic layer to serve as the storage layer, which, for example, is the magnetic layer 24 shown in FIG. 2, with the insulating film 27 located therebetween. As shown in FIG. 3(a), the control electrode 28 may surround the entire side surface of the magnetic layer 24 to serve as the storage layer. Alternatively, as shown in FIG. 3(b), the control electrode 28 may be divided into two or more control electrodes 28a, 28b (two in FIG. 3(b)), which are located on portions of the side surface of the magnetic layer 24 to serve as the storage layer, with the insulating film 27 located therebetween. Furthermore, as shown in FIG. 3(c), the control electrode 28 may be located on a portion of the magnetic layer 24 to serve as the storage layer with the insulating film 27 located therebetween. As described above, the control electrode 28 in this embodiment is located at least on the side surface of the magnetic layer to serve as the storage layer with the insulating film 27 located therebetween. FIGS. 3(a) to 3(c) are cross-sectional views taken along a plane parallel to the film plane of the magnetic layer to serve as the storage layer.

The magnetic layer to serve as the storage layer of the MTJ element 20 is formed of, for example, a metal containing at least one magnetic element selected from the group consisting of iron (Fe), cobalt (Co) and nickel (Ni), or an alloy containing at least one of such magnetic elements, or an oxide (ferrite) containing at least one of such magnetic elements. A layer of a compound or alloy containing a rare earth element such as neodymium (Nd), samarium (Sm), or terbium (Tb) and a magnetic element can also be used as the magnetic layer. The storage layer may have a multilayer structure including a first magnetic film, a second magnetic film, and a nonmagnetic film located between the first magnetic film and the second magnetic film.

The magnetic layer to serve as the reference layer may be an alloy layer or ordered alloy layer containing at least one magnetic element selected from the group consisting of Fe, Co and Ni and at least one element selected from the group consisting of Pt, Pd, Ru and Re, or may have a multilayer structure including a plurality of such layers. The reference layer may also have a multilayer structure including a first magnetic film, a second magnetic film, and a nonmagnetic film located between the first magnetic film and the second magnetic film. In such a case, the first magnetic film and the second magnetic film are magnetically coupled with each other with the nonmagnetic film located therebetween.

The tunnel barrier layer 23 may be formed of a thin oxide film of, for example MgO or $Al_2O_3$.

The insulating film 27 may be formed of, for example, an oxide, nitride, or fluoride containing at least one element selected from the group consisting of silicon (Si), aluminum (Al), magnesium (Mg), hafnium (Hf), cerium (Ce), strontium (Sr), tantalum (Ta), and titanium (Ti). The insulating film 27 is preferably formed of a dielectric substance having a high relative dielectric constant to improve the efficiency of controlling the energy barrier when the voltage is applied. The thickness of the insulating film 27 is set so that a leakage current generated by a voltage applied between the control electrode 28 for controlling the energy barrier and the multilayer structure 25 of the MTJ element 20 is satisfactorily lower than a current flowing between the upper electrode 26 and the lower electrode 21 of the MTJ element 20 in a write or read operation of the MTJ element 20 (first condition). On the other hand, however, the efficiency of controlling the anisotropic energy by means of a voltage is improved as the thickness of the insulating film 27 decreases (second condition). The thickness is required to meet both the first condition and the second condition. A preferable value in the actual insulating film 27 is in the range of 1 nm to 10 nm, although it may vary depending on the material of the insulating film 27, and the materials of the magnetic layers 22, 24 forming the MTJ element 20.

(Operating Method)

Next, a method of operating the magnetic memory of the first embodiment will be described below.

(Read Operation)

First, a read operation will be described. When data stored in the MTJ element 20 is to be read, a current is caused to flow between the upper electrode 26 and the lower electrode 21 shown in FIG. 2, and whether the magnetization of the storage layer 24 in the MTJ element 20 is in a parallel (low resistance) state or in an antiparallel (high resistance) state as compared to the magnetization of the reference layer 22 is read. In order to cause such a read current to flow, a voltage is applied between the storage layer 24 and the control electrode 28 to increase the energy barrier as shown by the chain line 11 in FIG. 1(d). For example, if the storage layer 24 is formed of CoFeB having perpendicular magnetization, and a potential higher than that of the storage layer is applied to the control electrode, the magnetic anisotropy energy in a direction perpendicular to the interface decreases, and the magnetic anisotropy energy in a direction parallel to the interface, i.e., perpendicular to the normal line of the interface, becomes stabler. If the storage layer 24 has the same voltage effect with the same polarity, the potential of the control electrode 28 is set to be positive relative to that of the storage layer 24. On the other hand, if the storage layer 24 is formed of FePd having the $L1_0$ structure, and a potential lower than that of the storage layer is applied to the control electrode, the magnetic anisotropy energy in a direction perpendicular to the interface decreases, and the magnetic anisotropy energy in a direction parallel to the interface, i.e., perpendicular to the normal line of the interface, becomes stabler. If the storage layer has the same voltage effect with the same polarity, the potential of the control electrode 28 is set to be negative relative to that of the storage layer 24. As a result, the probability of the read current switching the magnetization of the storage layer 24 decreases. In this manner occurrence of read disturb can be avoided.

(Data Retention State)

In the data retention state in which data is not written to or read from the MTJ element 20, the potential of the control electrode 28 is set to be substantially equal to that of the storage layer 24 so that the potential difference therebetween is 0.1 V or less, for example. This can be achieved by electrically connecting, for example, the control electrode 28 and either of the upper electrode 26 and the lower electrode 21. In this case, the potential energy of the storage layer 24 is in the state shown by the solid line 10 in FIG. 1(d). The energy barrier ΔE in the data retention state should be set to be sufficiently high so that the magnetization is not switched by thermal agitation during a required data retention time (for, example 10 years).

The potential of the control electrode 28 may be set so that the energy barrier ΔE in the data retention state required for magnetization switching becomes high. No inconvenience is caused in this case since the data retention time is elongated.

(Write Operation)

In a write operation, a current is caused to flow between the upper electrode 26 and the lower electrode 21 of the MTJ element 20 so that the direction of magnetization of the storage layer 24 is switched by spin transfer writing. The potential of the control electrode 28 when the write current is caused to flow is set so that the storage layer 24 and the control electrode 28 have substantially the same potential, and the potential difference therebetween is, for example, 0.1 V or less, or the energy barrier ΔE required for magnetization switching becomes low. If the potential is set so as to be substantially the same as the potential of the storage layer 24, the potential energy of the magnetization of the storage layer 24 is about the level shown by the solid line 10 in FIG. 1(d). Accordingly, the energy barrier ΔE required for magnetization switching is lower than that in the read operation. This can prevent an increase in the current needed for the write operation.

A voltage may be applied to the control electrode 28 so that, when a write current is caused to flow, the energy barrier ΔE needed for the magnetization switching decreases as shown by the chain line 12 in FIG. 1(d). In this case, the polarity of the voltage applied is opposite to that of the voltage applied in the read operation. Specifically, if the storage layer 24 is formed of CoFeB having perpendicular magnetization, or has the same voltage effect with the same polarity, the potential of the control electrode 28 is set to be negative relative to that of the storage layer 24. On the contrary, if the storage layer 24 is formed of FePd having the $L1_0$ structure, or has the same voltage effect with the same polarity, the potential of the control electrode 28 is set to be positive relative to that of the storage layer 24. As a result, the energy barrier ΔE needed for the magnetization switching in the write operation decreases. Accordingly, the write current needed for the spin transfer writing can be decreased.

Incidentally, if the magnetic memory of the first embodiment has a plurality of memory cells, and a voltage is applied to the control electrodes of the memory cells connected to the same wiring line at the same time, the energy barrier of MTJ elements that are not used for the write operation also decreases, which leads to a possible erroneous writing. For this reason, the voltage in the write operation should be controlled so that no erroneous writing occurs.

As described above, according to the first embodiment, the energy barrier needed for the magnetization switching in the storage layer can be controlled with a high efficiency. As a result, read disturb can be avoided. Furthermore, a magnetic memory having a margin for variations and fluctuations in pulse width of write and read pulses can be provided.

Second Embodiment

Figure 4:
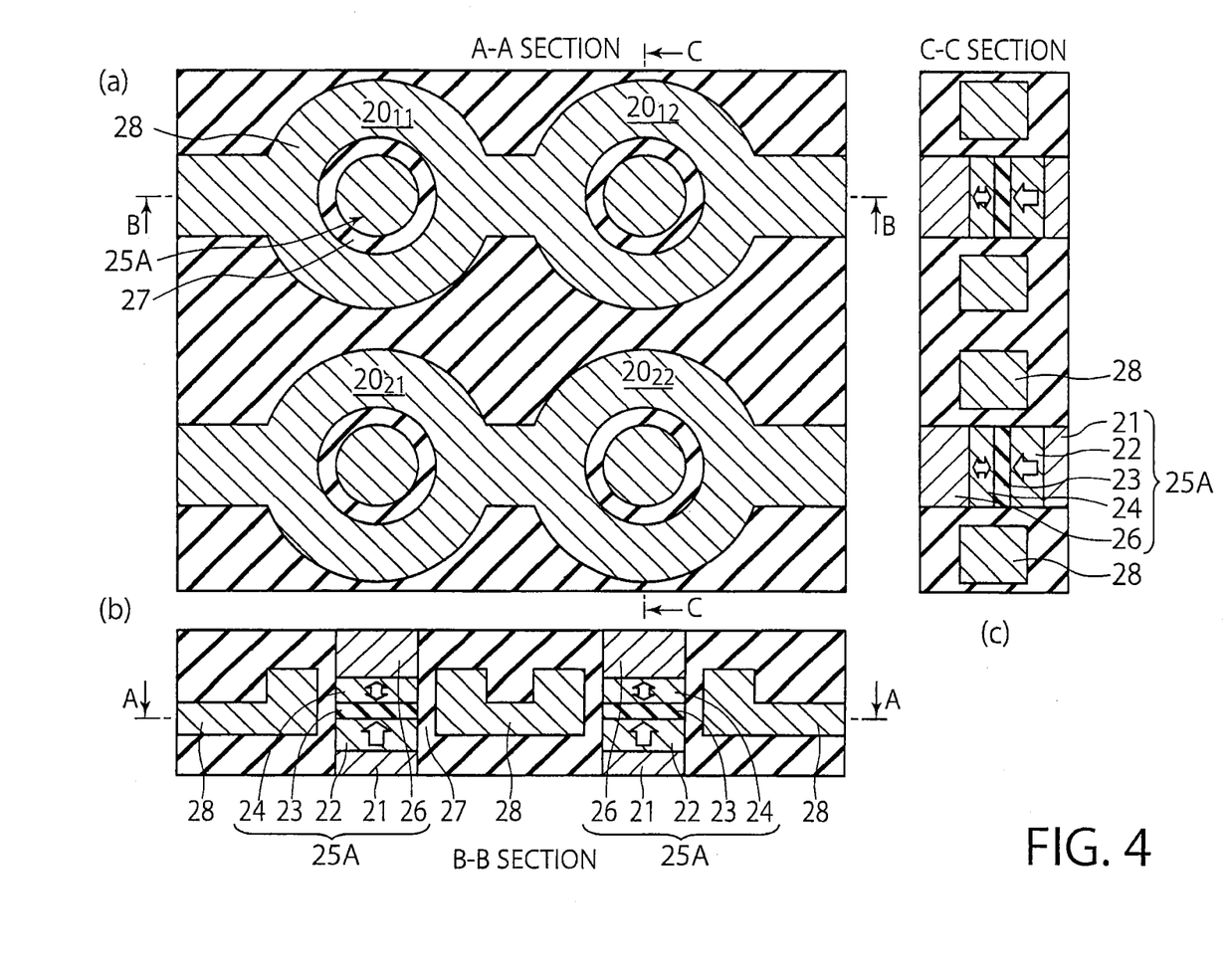
FIGS. 4(a) to 4(c) are cross-sectional views of a magnetic memory according to the second embodiment.

A magnetic memory according to the second embodiment will be described with reference to FIGS. 4(a) to 6. FIGS. 4(a) to 4(c) are cross-sectional views of a memory cell array of a magnetic memory according to the second embodiment. FIG. 4(a) is a cross-sectional view taken along line A-A of FIG. 4(b), FIG. 4(b) is a cross-sectional view taken along line B-B of FIG. 4(a), and FIG. 4(c) is a cross-sectional view taken along line C-C of FIG. 4(a).

The magnetic memory according to the second embodiment includes a plurality of memory cells arranged in a matrix form including, for example, 4 rows×4 columns, each memory cell having a MTJ element $20_{11}$, $20_{12}$, $20_{21}$, $20_{22}$ of the first embodiment as a storage element. Each MTJ element $20_{ij}$ (i=1, 2, j=1, 2) has a multilayer structure 25A including a lower electrode 21, a magnetic layer 22, a tunnel barrier layer 23, a magnetic layer 24, and an upper electrode 26 that are stacked in this order. An insulating film 27 surrounds the multilayer structure 25A, and a control electrode 28 surrounds the insulating film 27. The control electrode 28 of each MTJ element $20_{ij}$ (i=1, 2, j=1, 2) surrounds the side surface of the magnetic layer 24 to serve as a storage layer with the insulating film 27 located therebetween. The control electrodes 28 of MTJ elements arranged on the same row, for example the MTJ elements $20_{11}$ and $20_{12}$, are electrically connected with each other to have a common control wiring line.

Figure 5:
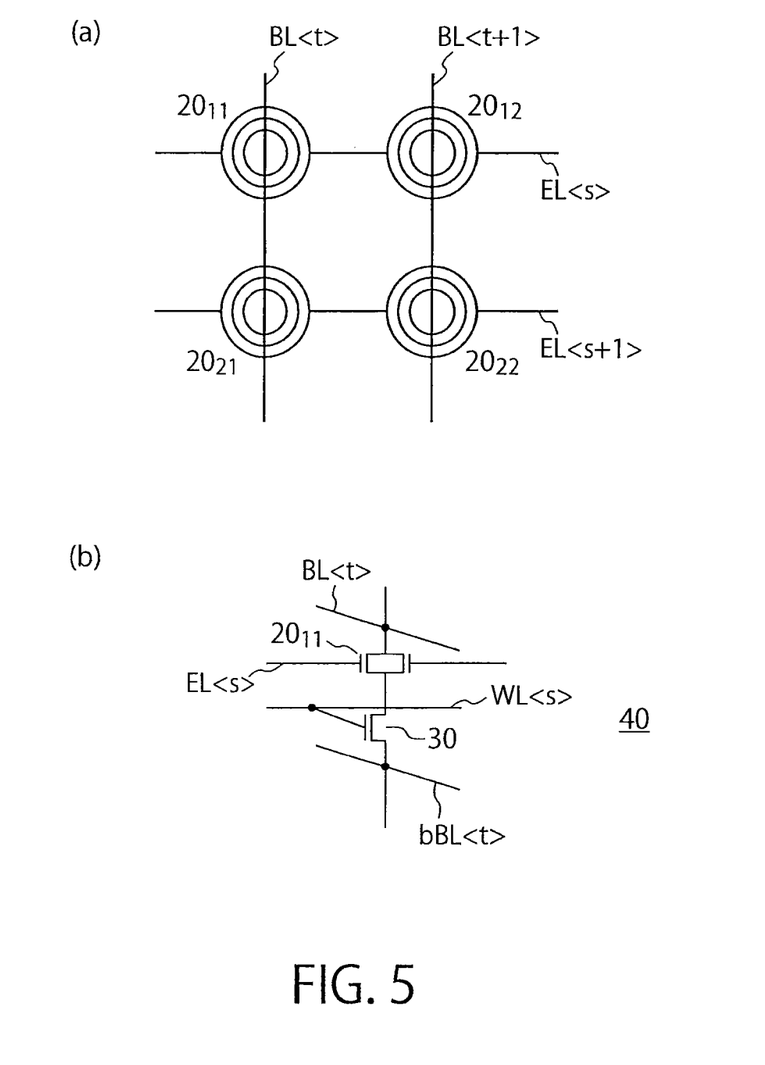
FIGS. 5(a) and 5(b) are diagrams explaining a memory cell array.

A memory cell structure of the second embodiment will be described with reference to FIGS. 5(a) and 5(b). As shown in FIG. 5(a), a bit line is connected to the upper electrode 26 of each of the MTJ elements $20_{11}$ to $20_{22}$, the bit line connecting to the upper electrodes 26 of the MTJ element $20_{11}$ and the MTJ element $20_{21}$ being BL<t>, and the bit line connecting to the upper electrodes 26 of the MTJ element $20_{12}$ and the MTJ element $20_{22}$ being BL<t+1>.

The control wiring lines extend in a direction crossing the bit lines, the control wiring line connecting to the control electrode 28, which surrounds the side surfaces of the MTJ element $20_{11}$ and the MTJ element $20_{12}$ with the insulating film 27 located therebetween, being EL<s>, and the control wiring line connecting to the control electrode 28, which surrounds the side surfaces of the MTJ element $20_{21}$ and the MTJ element $20_{22}$ with the insulating film 27 located therebetween, being EL<s+1>.

FIG. 5(b) is a diagram showing the memory cell 40 including the MTJ element $20_{11}$. The lower electrode 21 of the MTJ element $20_{11}$ is connected to one of the source and the drain of a selection transistor 30, although this is not shown in FIG. 5(a). The other of the source and the drain of the selection transistor 30 is connected to the bit line bBL<t>. The gate of the selection transistor 30 is connected to a word line WL<s> that is in parallel to the control wiring line EL<s>. Although FIG. 5(b) shows an example of the memory cell 40 including the MTJ element $20_{11}$, the other memory cells also have the same structure.

Figure 6:
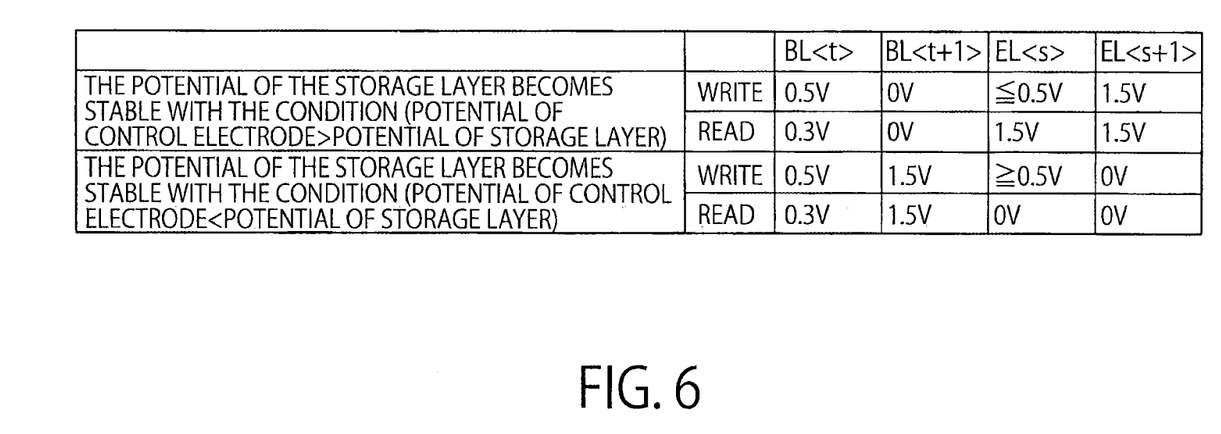
FIG. 6 is a diagram showing an example of potential setting of bit lines and control wiring lines when a memory cell is selected for reading and writing operations.

FIG. 6 shows an example of potential setting of the bit lines and the control wiring lines when the MTJ element $20_{11}$ shown in FIG. 5(a) is selected to perform a read operation and a write operation. As described above, the potential setting differs between the case where the potential of the control electrode 28 is set to be higher than the potential of the storage layer 24 to increase the energy barrier to make the direction of magnetization in the storage layer 24 stable as in the case of the magnetic layer of CoFeB, and the case where the potential of the control electrode 28 is set to be lower than the potential of the storage layer 24 to make the magnetization in the storage layer 24 stable as in the case of the magnetic layer of FePd. Let the bit line potential of write operation be 0.5 V, and of read operation be 0.3 V as an example of potential setting.

If the potential of the control electrode 28 is set to be higher than that of the storage layer 24 to increase the energy barrier so that the magnetization of the storage layer 24 becomes stable, as in the case where the magnetic layer is formed of CoFeB, the potential of the control wiring line EL<s+1> in a write operation is set at a high potential (for example 1.5 V) to make stable the magnetization of the storage layers 24 of the MTJ elements connecting to the control wiring line EL<s+1>.

On the other hand, the potential of the control wiring line EL<s>, to which selected cell is connected, is set at a potential closer to or less than the potential of the storage layer 24 (for example 0.5 V) of the MTJ element $20_{11}$ on which the write operation is performed. In this manner, an increase of write current caused by the increase in energy barrier of the storage layer 24 of the MTJ element $20_{11}$ can be prevented. In this setting state, a pulse voltage is applied to the bit line BL<t> to perform a write operation on the MTJ element $20_{11}$ while the potential of the bit line BL<t+1> is fixed to 0 V. As a result, the MTJ element $20_{12}$ is also controlled so that the potential of the control electrode 28 is higher than that of the storage layer 24. Accordingly, erroneous writing can also be prevented.

In a read operation, both the control wiring line EL<s> and the control wiring line EL<s+1> are set at a high potential (for example 1.5 V). In this state, a pulse voltage for reading is applied to the bit line BL<t>, and the state of the magnetization of the storage layer 24 in the MTJ element $20_{11}$ is detected by a sense amplifier. During the read operation, the potential of the bit line BL<t+1> is fixed to 0 V.

If the potential of the control electrode 28 is set to be lower than that of the storage layer 24 to make the magnetization of the storage layer 24 stable, as in the case where the magnetic layer is formed of FePd, the potential of the control wiring line EL<s+1> is set at 0 V to prevent erroneous writing to non-selected cells. In a write operation, the potential of the control wiring line EL<s> is set at the potential of the storage layer 24 (for example 0.5 V) of the memory cell on which the write operation is performed or higher in order to prevent an increase in inverse current. In this state, a write pulse voltage (for example 0.5 V) is applied to the bit line BL<t> to perform a write operation. During the write operation, the potential of the bit line BL<t+1> is maintained to be a high potential (for example 1.5 V).

In a read operation, potentials of both the control wiring line EL<s> and the control wiring line EL<s+1> are set to be 0 V. In this setting state, a read voltage (for example 0.3 V) is applied to the bit line BL<t>, and the magnetization state of the MTJ element $20_{11}$ is detected by the sense amplifier. Such an operation may prevent read disturb. During the read operation, the potential of the bit line BL<t+1> is set to be a high potential (for example 1.5 V).

Although the voltage required in the write operation for making the magnetization of the storage layer of the MTJ element parallel to the magnetization of the reference layer differs from the voltage required in the write operation for making the above magnetizations antiparallel, only one example has been described for the simplification of descriptions, and detailed descriptions are omitted. The above example is for a write operation for making the magnetization of the storage layer of the MTJ element parallel to the magnetization of the reference layer in the MTJ element in which the storage layer is located on the side opposite to the side of the selection transistor relative to the reference layer. In actual cases, the potentials of the respective bit lines and control wiring lines are adjusted depending on respective write and read conditions.

Figure 7:
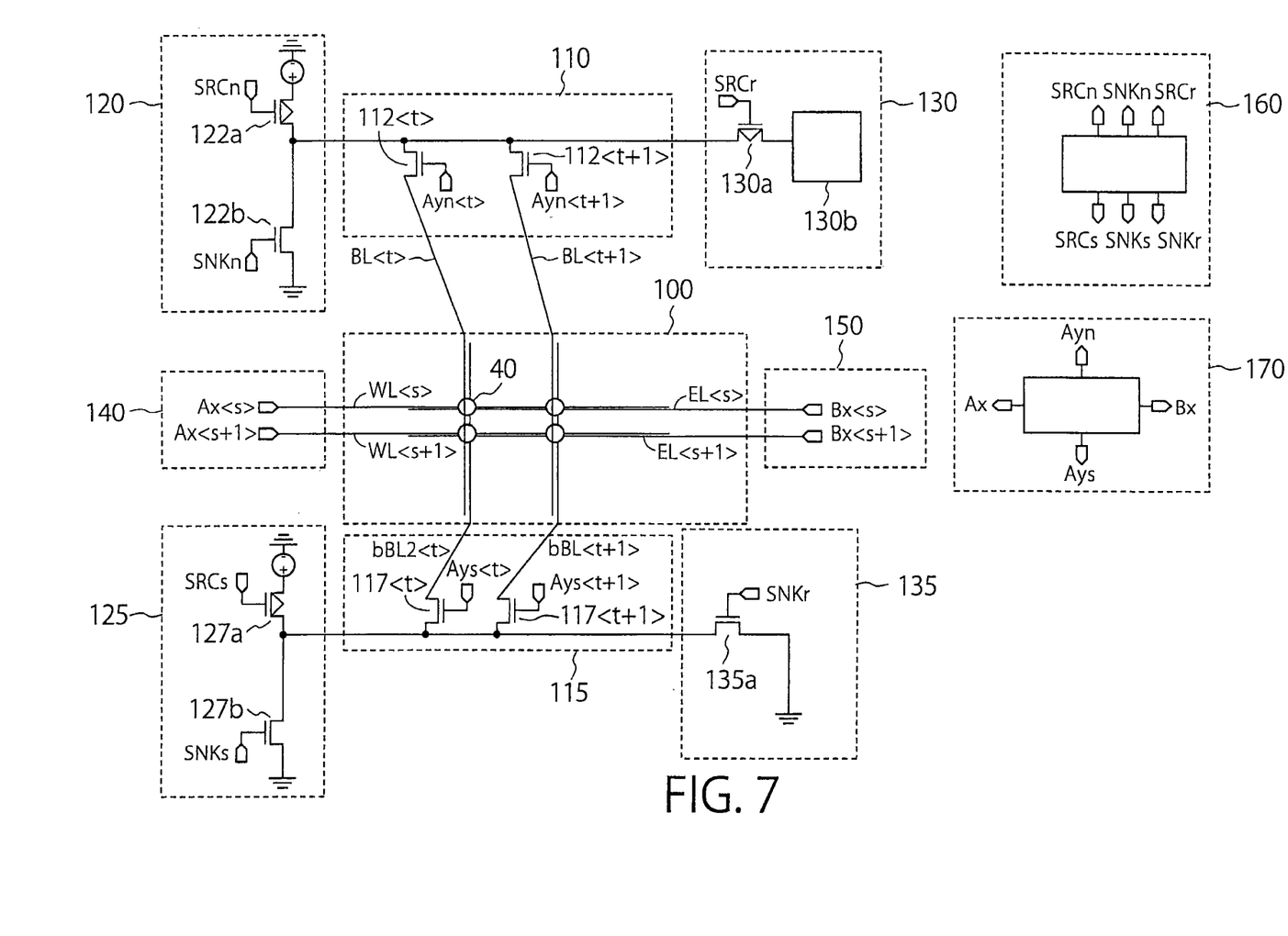
FIG. 7 is a circuit diagram showing an example of circuit configuration of the magnetic memory according to the second embodiment.

FIG. 7 shows an example of circuit diagram of the magnetic memory according to the second embodiment. Each memory cell 40 within a memory cell array 100 is the same as the memory cell 40 shown in FIG. 5(b), and is connected to a first bit line (conductive line) BL<t>, BL<t+1>, a second bit line (conductive line) bBL<t>, bBL<t+1>, a word line (conductive line) WL<s>, WL<s+1>, and a control wiring line (conductive line) EL<s>, EL<s+1>.

The first bit line BL<t>, BL<t+1> is connected to a write circuit 120 and a readout circuit 130 via a bit line selection circuit 110. The bit line selection circuit 110 includes switching elements (FETs) 112<t>, 112<t+1> that are turned on or off by control signals Ayn<t>, Ayn<t+1>, respectively.

The write circuit 120 includes switching elements (FETs) 122a, 122b that are turned on or off by control signals SRCn, SNKn, respectively.

The readout circuit 130 includes a switching element (FET) 130a that is turned on or off by a control signal SRCr, and a sense amplifier 130b.

The second bit line bBL<t>, bBL<t+1> is connected to a write circuit 125 and a readout circuit 135 via a bit line selection circuit 115. The bit line selection circuit 115 includes switching elements (FETs) 117<t>, 117<t+1> that are turned on or off by control signals Ays<t>, Ays<t+1>, respectively.

The write circuit 125 includes switching elements (FETs) 127a, 127b that are turned on or off by control signals SRCs, SNKs, respectively.

The readout circuit 135 includes a switching element (FET) 135 that is turned on or off by a control signal SNKr.

The respective word lines WL<s>, WL<s+1> are connected to a word line selection circuit 140. The word line selection circuit 140 drives the word lines WL<s>, WL<s+1> with control signals Ax<s>, Ax<s+1>, respectively.

The respective control wiring lines EL<s>, EL<s+1> are connected to a control wiring line selection circuit 150. The control wiring line selection circuit 150 drives the control wiring lines EL<s>, EL<s+1> with control signals Bx<s>, Bx<s+1>, respectively.

A control circuit 160 generates the control signals SRCn, SNKn, SRCs, SNKs, SRCr, SNKr. A decoder 170 generates the control signals Ayn, Ays, Ax, Bx. The control signals Ayn, Ays, Ax, Bx represent all the corresponding control signals.

Like the first embodiment, the second embodiment can control the energy barrier needed for magnetization switching in the storage layer with a high efficiency, thereby avoiding read disturb. Furthermore, the second embodiment can provide a magnetic memory that has a margin to deal with variations and fluctuations of write and read pulse widths.

Third Embodiment

A magnetic memory according to the third embodiment will be described with reference to FIG. 8. The magnetic memory according to the third embodiment includes at least one memory cell having an MTJ element serving as a storage element. The MTJ element of the first embodiment shown in FIG. 3, in which both the reference layer and the storage layer are magnetic layers with the magnetization parallel to the film plane, is used in the third embodiment. A magnetic layer having the direction of magnetization parallel to the film plane has a shape anisotropy with which the element shape (in-plane shape) has a long axis serving as an easy magnetization axis, and a short axis serving as a hard magnetization axis.

Figure 8:
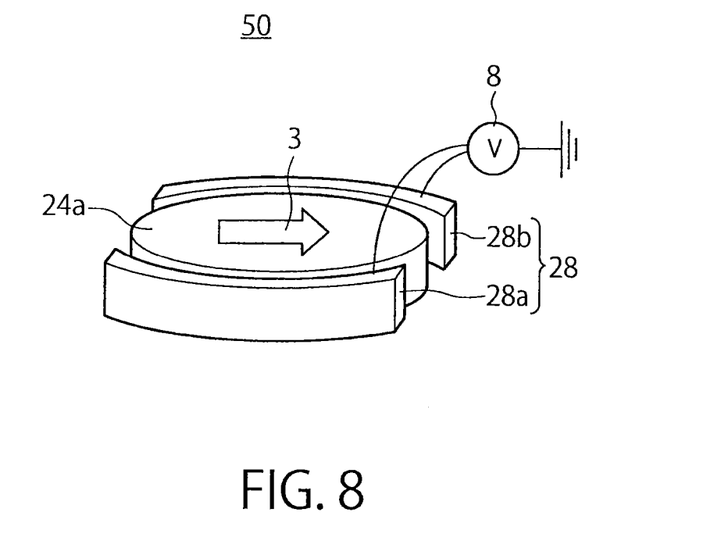
FIG. 8 is a perspective view for explaining a positional relationship between a storage layer and a control electrode in a magnetic memory according to the third embodiment.

FIG. 8 is a perspective view for explaining the positional relationship between the storage layer and the control electrode in the magnetic memory according to the third embodiment. The MTJ element of the magnetic memory according to the third embodiment has the control electrode 28 located near the side surface of the storage layer 24a with an insulating film (not shown) located therebetween. The control electrode 28 is divided into two control electrodes 28a, 28b arranged along the longer side surfaces of the storage layer 24a. If a voltage is applied to the control electrodes 28a, 28b from a power supply 8, the energy barrier can be controlled when the magnetization 3 is oriented along the short axis direction, which is the hard magnetization axis direction, as in the first embodiment. Accordingly, the probability of the occurrence of read disturb can be reduced. Unlike the state shown in FIG. 8, if the control electrode 28 is arranged to cover the entire side surface of the storage layer 24a as shown in FIG. 3(a), an electric field is also generated in the long axis direction, which is the easy magnetization axis direction. Accordingly, the efficiency of controlling the energy barrier for magnetization switching becomes worse. However, since the length of the side surface (interface) of the storage layer 24a differs between the long side in the long axis direction and the short side in the short axis direction, the short side has superiority. Accordingly, the energy barrier can be controlled.

Like the first embodiment, the third embodiment can control the energy barrier needed for switching the direction of magnetization in the storage layer with a high efficiency, thereby avoiding read disturb. Furthermore, the third embodiment can provide a magnetic memory having a margin to deal with variations and fluctuations in write and read pulse widths.

As described above, according to the respective embodiments, the probability of the occurrence of read disturb can be reduced. The write operation can be performed based on spin transfer effect. As a result, a memory operation can be performed, in which the probabilities of occurrence of writing errors and the occurrence of read disturb are satisfactorily low.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A magnetic memory comprising at least one element, the element comprising:
   a multilayer structure including a first magnetic layer in which a direction of magnetization is fixed, a second magnetic layer in which a direction of magnetization is changeable, and a nonmagnetic layer located between the first magnetic layer and the second magnetic layer, the multilayer structure having a first surface, a second surface opposed to the first surface, and a side surface different from the first surface and the second surface;
   a first electrode provided on the first surface of the multilayer structure and electrically connected to the first magnetic layer;
   a second electrode provided on the second surface of the multilayer structure and electrically connected to the second magnetic layer;
   an insulating film provided on the side surface of the multilayer structure;
   a control electrode provided on the side surface of the multilayer structure with the insulating film located therebetween;
   a voltage applying circuit that applies a voltage to the control electrode in a read operation; and
   a readout circuit that flows a read current between the first electrode and the second electrode to read information from the element.

2. The memory according to claim 1, further comprising:
   a write circuit that flows a write current between the first electrode and the second electrode to write information to the element,
   wherein when the write circuit writes the information to the element, the voltage applying circuit applies the voltage to the control electrode so that a potential of the control electrode is identical with a potential of the second magnetic layer, or an energy barrier for changing the magnetization of the second magnetic layer is reduced.

3. A magnetic memory comprising at least one element, the element comprising:
   a multilayer structure including a first magnetic layer in which a direction of magnetization is fixed, a second magnetic layer in which a direction of magnetization is changeable, and a nonmagnetic layer located between the first magnetic layer and the second magnetic layer, the magnetization of the first and the second magnetic layers being perpendicular to a film plane, and the multilayer structure having a first surface, a second surface opposed to the first surface, and a side surface different from the first surface and the second surface;
   a first electrode provided on the first surface of the multilayer structure and electrically connected to the first magnetic layer;
   a second electrode provided on the second surface of the multilayer structure and electrically connected to the second magnetic layer;
   an insulating film provided on the side surface of the multilayer structure; and
   a control electrode provided on the side surface of the multilayer structure with the insulating film located therebetween.

4. The memory according to claim 1, wherein the magnetization of the first and the second magnetic layers is parallel to a film plane.

5. A magnetic memory comprising at least one element, the element comprising:
   a multilayer structure including a first magnetic layer in which a direction of magnetization is fixed, a second magnetic layer in which a direction of magnetization is changeable, and a nonmagnetic layer located between the first magnetic layer and the second magnetic layer, and the multilayer structure having a first surface, a second surface opposed to the first surface, and a side surface different from the first surface and the second surface;
   a first electrode provided on the first surface of the multilayer structure and electrically connected to the first magnetic layer;
   a second electrode provided on the second surface of the multilayer structure and electrically connected to the second magnetic layer;
   an insulating film provided on the side surface of the multilayer structure; and
   a control electrode provided on the side surface of the multilayer structure with the insulating film located therebetween, the control electrode surrounding the entire side surface of the second magnetic layer.

6. The memory according to claim 1, wherein the control electrode is divided into a plurality of portions each provided on a part of the side surface of the second magnetic layer with the insulating film being located therebetween.

7. A magnetic memory comprising at least one element, the element comprising:
  a multilayer structure including a first magnetic layer in which a direction of magnetization is fixed, a second magnetic layer in which a direction of magnetization is changeable, and a nonmagnetic layer located between the first magnetic layer and the second magnetic layer, and the multilayer structure having a first surface, a second surface opposed to the first surface, and a side surface different from the first surface and the second surface;
  a first electrode provided on the first surface of the multilayer structure and electrically connected to the first magnetic layer;
  a second electrode provided on the second surface of the multilayer structure and electrically connected to the second magnetic layer;
  an insulating film provided on the side surface of the multilayer structure; and
  a control electrode provided on the side surface of the multilayer structure with the insulating film located therebetween,
  wherein the at least one element includes two or more elements arranged in a matrix form, in which the control electrodes of the elements on a common row are connected to each other.

8. A magnetic memory comprising:
  an element including:
  a multilayer structure including a first magnetic layer in which a direction of magnetization is fixed, a second magnetic layer in which a direction of magnetization is changeable, and a nonmagnetic layer located between the first magnetic layer and the second magnetic layer, and the multilayer structure having a first surface, a second surface opposed to the first surface, and a side surface different from the first surface and the second surface;
  a first electrode provided on the first surface of the magnetic multilayer structure and electrically connected to the first magnetic layer;
  a second electrode provided on the second surface of the multilayer structure and electrically connected to the second magnetic layer;
  an insulating film provided on the side surface of the multilayer structure; and
  a control electrode provided on the side surface of the multilayer structure with the insulating film being located therebetween, a voltage being applied to the control electrode in a read operation,
  a selection transistor of which one of a source and a drain is connected to one of the first and the second electrodes of the element;
  a first wiring line connecting to a gate of the selection transistor;
  a second wiring line connecting to the other of the first and the second electrodes of the element;
  a third wiring line connecting to the other of the source and the drain of the selection transistor; and
  a fourth wiring line connecting to the control electrode.

9. The memory according to claim 8, further comprising:
  a voltage applying circuit that applies a voltage to the control electrode; and
  a readout circuit that flows a read current between the first electrode and the second electrode to read information from the element.

10. The memory according to claim 9, further comprising:
  a write circuit that flows a write current between the first electrode and the second electrode to write information to the element,
  wherein when the write circuit writes the information to the element, the voltage applying circuit applies the voltage to the control electrode so that a potential of the control electrode is identical to a potential of the second magnetic layer, or an energy barrier for changing magnetization of the second magnetic layer is reduced.

11. The memory according to claim 8, wherein the magnetization of the first and the second magnetic layers is perpendicular to [Ethel] a film plane.

12. The memory according to claim 8, wherein the magnetization of the first and the second magnetic layers is parallel to a film plane.

13. The memory according to claim 8, wherein the control electrode is provided to surround the entire side surface of the second magnetic layer.

14. The memory according to claim 8, wherein the control electrode is divided into a plurality of portions each located on a part of the side surface of the second magnetic layer with the insulating film being located therebetween.

15. The memory according to claim 8, wherein the at least one element includes two or more elements arranged in a matrix form, in which the control electrodes of the elements on a common row are connected with each other.

16. The memory according to claim 1,
  wherein the control electrode faces side surfaces of the first and the second magnetic layers.

17. The memory according to claim 16, further comprising:
  a write circuit that flows a write current between the first electrode and the second electrode to write information to the element,
  wherein when the write circuit writes the information to the element, the voltage applying circuit applies the voltage to the control electrode so that a potential of the control electrode is identical with a potential of the second magnetic layer, or an energy barrier for changing magnetization of the second magnetic layer is reduced.

18. The memory according to claim 16, wherein the magnetization of the first and the second magnetic layers is perpendicular to a film plane.

19. The memory according to claim 16, wherein the magnetization of the first and the second magnetic layers is parallel to a film plane.

20. The memory according to claim 16, wherein the control electrode surrounds the entire side surface of the second magnetic layer.

21. The memory according to claim 16, wherein the control electrode is divided into a plurality of portions each located on a part of the side surface of the second magnetic layer with the insulating film located therebetween.

22. The memory according to claim 16, wherein the at least one element includes two or more elements arranged in a matrix form, in which the control electrodes of the elements on a common row are connected with each other.

* * * * *